United States Patent
Wang et al.

(10) Patent No.: US 11,137,919 B2
(45) Date of Patent: Oct. 5, 2021

(54) INITIALISATION OF A STORAGE DEVICE

(71) Applicant: ARM Ltd., Cambridge (GB)

(72) Inventors: Wei Wang, Cambridge (GB); Wendy Arnott Elsasser, Austin, TX (US); Stephan Diestelhorst, Cambridge (GB)

(73) Assignee: ARM Ltd., Cambridge (GB)

( * ) Notice: Subject to any disclaimer, the term of this patent is extended or adjusted under 35 U.S.C. 154(b) by 62 days.

(21) Appl. No.: 15/798,259

(22) Filed: Oct. 30, 2017

(65) Prior Publication Data

US 2019/0129633 A1    May 2, 2019

(51) Int. Cl.
| | |
|---|---|
| *G06F 3/00* | (2006.01) |
| *G06F 3/06* | (2006.01) |
| *G06F 13/16* | (2006.01) |
| *G06F 12/02* | (2006.01) |

(Continued)

(52) U.S. Cl.
CPC .......... *G06F 3/0632* (2013.01); *G06F 3/0607* (2013.01); *G06F 3/0653* (2013.01); *G06F 3/0659* (2013.01); *G06F 3/0685* (2013.01); *G06F 12/0238* (2013.01); *G06F 12/0891* (2013.01); *G06F 13/16* (2013.01); *G06F 13/1626* (2013.01); *G06F 2212/7203* (2013.01); *G06F 2212/7205* (2013.01); *G11C 7/20* (2013.01)

(58) Field of Classification Search
None
See application file for complete search history.

(56) References Cited

U.S. PATENT DOCUMENTS

| | | |
|---|---|---|
| 4,984,215 A | 1/1991 | Ushida |
| 5,325,325 A | 6/1994 | Azuma |
| 6,571,312 B1 | 5/2003 | Sugai et al. |

(Continued)

FOREIGN PATENT DOCUMENTS

| | | |
|---|---|---|
| GB | 2561011 A | 3/2017 |
| GB | 2561011 A | 10/2018 |

(Continued)

OTHER PUBLICATIONS

Notification of Transmittal of the International Search Report and the Written Opinion of the International Searching Authority, or the Declaration, dated Aug. 22, 2018, International Application No. PCT/GB2018/050782, 21 pgs.

(Continued)

*Primary Examiner* — Craig S Goldschmidt
(74) *Attorney, Agent, or Firm* — Berkeley Law & Technology Group, LLP

(57) ABSTRACT

Disclosed are devices, method and/or systems for responding to a request for accessing a portion of a memory prior to completion of a requested operation to place the portion of the memory in an initialized state. In one example implementation, a memory controller may delay initiation of a write operation addressed to a particular portion of the memory until completion of a pending request to initialize the particular portion of the memory. In another example implementation, a memory controller may return values to service a request for a read operation comprising values representing an initialized state without accessing the particular portion of the memory responsive to a presence of a pending request to initialize the particular portion of the memory.

15 Claims, 9 Drawing Sheets

(51) Int. Cl.
*G06F 12/0891* (2016.01)
*G11C 7/20* (2006.01)

(56) References Cited

U.S. PATENT DOCUMENTS

| | | | |
|---|---|---|---|
| 6,857,059 B2* | 2/2005 | Karpoff | G06F 3/0605 |
| | | | 711/114 |
| 7,200,743 B1 | 4/2007 | Malpass | |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 9,786,370 B2 | 10/2017 | Aitken et al. | |
| 9,792,982 B1 | 10/2017 | Sandhu | |
| 9,792,984 B1 | 10/2017 | Bhavnagarwala et al. | |
| 9,805,777 B2 | 10/2017 | Sandhu et al. | |
| 9,851,738 B2 | 12/2017 | Sandhu et al. | |
| 9,871,528 B1 | 1/2018 | Kumar et al. | |
| 9,899,083 B1 | 2/2018 | Rosendale | |
| 9,947,402 B1 | 4/2018 | Bhavnagarwala et al. | |
| 9,972,388 B2 | 5/2018 | Das et al. | |
| 9,978,942 B2 | 5/2018 | Shifren et al. | |
| 9,979,385 B2 | 5/2018 | Sandhu et al. | |
| 9,990,992 B2 | 6/2018 | Bhavnagarwala et al. | |
| 9,997,424 B2 | 6/2018 | Arvin et al. | |
| 10,002,665 B1 | 6/2018 | Bhargava et al. | |
| 10,002,669 B1 | 6/2018 | Bhargava et al. | |
| 10,032,487 B2 | 7/2018 | Shifren et al. | |
| 2001/0046173 A1 | 11/2001 | Yoshikoshi | |
| 2005/0097294 A1* | 5/2005 | Hepkin | G06F 9/4812 |
| | | | 711/170 |
| 2006/0136682 A1* | 6/2006 | Haridas | G11C 7/20 |
| | | | 711/154 |
| 2008/0094877 A1 | 4/2008 | Schneider | |
| 2008/0107801 A1 | 5/2008 | Celinska et al. | |
| 2008/0159059 A1* | 7/2008 | Moyer | G06F 11/1008 |
| | | | 365/236 |
| 2011/0032784 A1 | 2/2011 | Pyeon | |
| 2012/0303910 A1* | 11/2012 | Ma | G06F 11/3632 |
| | | | 711/154 |
| 2013/0285699 A1 | 10/2013 | McWilliams et al. | |
| 2015/0055406 A1* | 2/2015 | Andre | G11C 11/1673 |
| | | | 365/158 |
| 2016/0163978 A1 | 6/2016 | Paz De Araujo et al. | |
| 2017/0047116 A1 | 2/2017 | Sandhu et al. | |
| 2017/0069378 A1 | 3/2017 | Shifren et al. | |
| 2017/0092858 A1 | 3/2017 | Shifren | |
| 2017/0147207 A1 | 5/2017 | Hansson et al. | |
| 2017/0244027 A1 | 8/2017 | Reid et al. | |
| 2017/0244032 A1 | 8/2017 | Reid et al. | |
| 2017/0288675 A1 | 10/2017 | Chandra et al. | |
| 2018/0095114 A1 | 4/2018 | Bhargave et al. | |

FOREIGN PATENT DOCUMENTS

| | | |
|---|---|---|
| JP | S61105793 A1 | 5/1986 |
| WO | 2017025761 A1 | 2/2017 |
| WO | 2018178644 A1 | 10/2018 |

OTHER PUBLICATIONS

Search and Examination Report, dated May 25, 2017, International Application No. GB1705294.5, 10 pgs.
Notification of Transmittal of the International Search Report and the Written Opinion of the International Searching Authority, or the Declaration, App. No. PCT/GB2018/052997, dated Jan. 22, 2019, 1 Page.
International Search Report, App. No. PCT/GB2018/052997, dated Jan. 22, 2019, 4 Pages.
Written Opinion of the International Searching Authority, App. No. PCT/GB2018/052997, dated Jan. 22, 2019, 7 Pages.

* cited by examiner

| Order | Write Queue 20 | Initialization Queue 25 | Read Queue 22 |
|---|---|---|---|
| 0 | X | D | X |
| 1 | X | X | E |
| 2 | A | X | X |
| ... | ... | ... | ... |

*FIG. 2C*

INITIALISATION OF A STORAGE DEVICE

BACKGROUND

1. Field

The present disclosure relates to techniques for accessing memory in computing systems, and particularly, but not exclusively, to techniques for initialising bits in memory.

2. Information

In a computing system, different applications (or processes) may use the same memory, whereby it is possible for a subsequent application to access or recover data from memory that was used by a previous application, and whereby the recovered data may include sensitive/security information. Such access may occur, for example, in systems with persistent memory after rebooting from power failures.

To prevent such access, the memory, or a portion thereof, may be initialised before access by an application, or to increase the efficiency of an application (e.g. a cryptographic operation).

Such initialisation may include Kernel zeroing for initialization so data will not be leaked to another process.

Furthermore, a Linux platform may perform lazy initializing when pages are being written to, e.g. "Copy-on-Write", whilst a FreeBSD platform may perform eager initialization, by initialising a plurality of pages of memory over multiple clock cycles and maintaining a memory pool for allocation. Userspace applications are required to initialise heap memory pages after allocation by memset as in C, or initialised implicitly by constructors as in C++ or C #.

Furthermore still, hypervisors initialise physical pages over multiple clock cycles before allocating those pages to another machine, e.g. for inter-virtual machine security/data privacy.

SUMMARY

Briefly, one particular implementation is directed to a controller device comprising: a first buffer to maintain a record of pending requests to initialize states of portions of a memory, the pending requests including at least a first pending request to initialize a state of a first portion of the memory; and circuitry configured to delay initiation of a write operation addressed to a second portion of the memory until completion of an operation to service the first pending request to initialize the state of the first portion of the memory.

Another particular implementation is directed to a method, at a controller device, comprising: maintaining a record of pending requests to initialize states of portions of a memory in a first buffer, the pending requests including at least a first pending request to initialize a state of a first portion of the memory; and delaying initiation of a write operation addressed to a second portion of the memory until completion of an operation to service the first pending request to initialize the state of the first portion of the memory.

Another particular implementation is directed to a controller device comprising: a first buffer to maintain a record of pending requests to initialize states of portions of a memory, the pending requests including at least a first pending request to initialize a state of a first portion of the memory; and circuitry configured to return values to service a request for an operation to read a second portion of the memory comprising values representing an initialized state without accessing the second portion of the memory responsive to detection of the first pending request to initialize the first portion of the memory.

Another particular implementation is directed to a method, at a controller device, comprising: maintaining a record of pending requests to initialize states of portions of a memory in a first buffer, the pending requests including at least a first pending request to initialize a state of a first portion of the memory; and returning values to service a request for an operation to read a second portion of the memory comprising values representing an initialized state without accessing the second portion of the memory responsive to detection of the first pending request to initialize the first portion of the memory.

Another particular implementation is directed to a method, at a controller device, comprising: maintaining a record, in a first buffer, of pending requests to perform operations to initialize states of portions of a memory, the pending requests including at least a first pending request to perform an operation to initialize a state of a first portion of the memory; and conditionally merging a requested write operation with the operation to initialize the state of the first portion of the memory request, the write operation being addressed to a second portion of the memory within the first portion of the memory, in the absence of a request to perform a read operation to precede the write operation.

Another particular implementation is directed to a controller device comprising: a first buffer to maintain a record of pending requests to initialize states of portions of a memory, the pending requests including at least a first pending request to initialize a state of a first portion of the memory; and circuitry configured to conditionally merge a requested write operation with the operation to initialize the state of the first portion of the memory, the write operation being addressed to a second portion of the memory within the first portion of the memory, in the absence of a request to perform a read operation to precede the write operation.

It should be understood that the aforementioned implementations are merely example implementations, and that claimed subject matter is not necessarily limited to any particular aspect of these example implementations.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

FIG. 2C is a schematic diagram of a queues of a controller device according to an embodiment;

Figure 1:
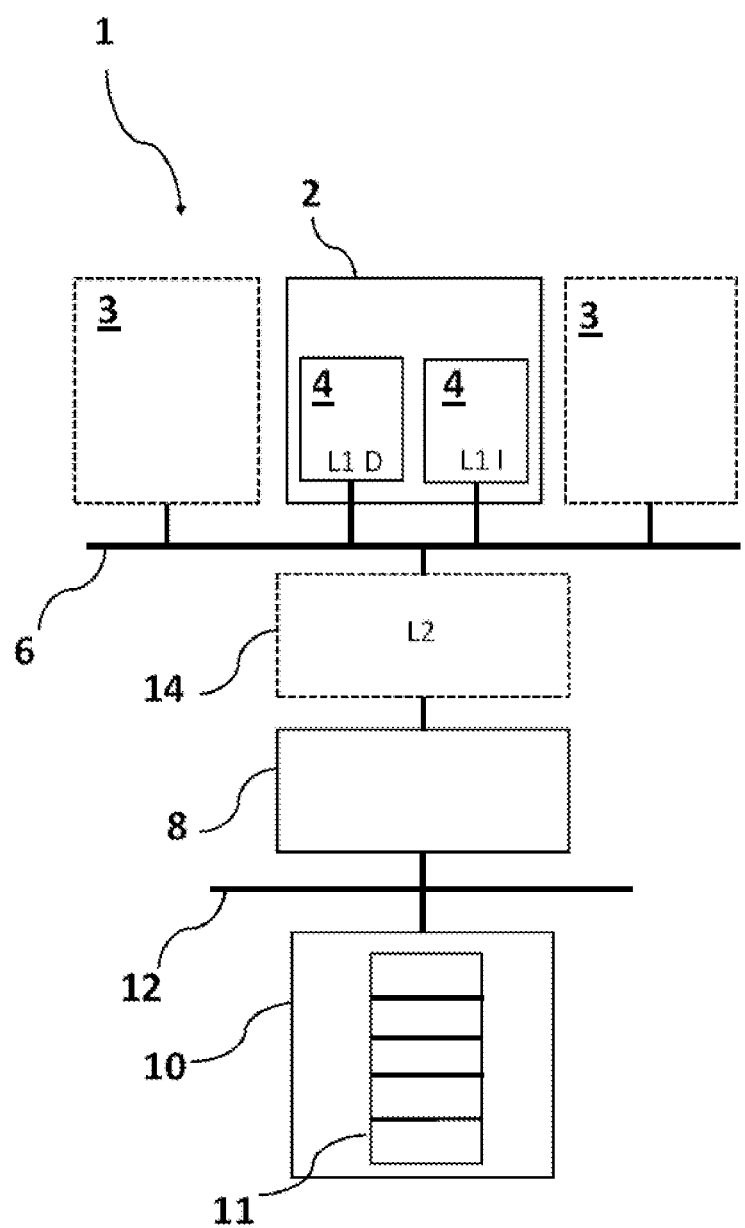
FIG. 1 schematically shows a block diagram of a computing system in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Computer memories may be initialized using any one of several different techniques including, for example, using looping writes that may give rise to cache pollution. Such cache pollution may further give rise to evictions of other lines that are dirty and valid (e.g., entailing unnecessary write backs to non-volatile memory (NVM) devices impacting performance and impacting durability of the NVM devices) and additional movement of data between off-chip NVM and on-chip cache. While using non-temporal stores to initial memory may avoid cache pollution and movement of data between off-chip NVM and on-chip cache, this may entail long write latencies that stall application execution.

Given expected increases in densities of NVM, terabyte capacity NVM as main memory is expected to become a reality in the near future, and memory initialization even at cacheline granularity may not be sufficient. In one approach, range-based cache memory operations (CMOs) may enable initialization of a portion of memory using fewer CMOs, thereby using fewer operation and acknowledge cycles. In other words, range-based bulk operations may more efficiently initialize a range than current finer grain instructions.

In one implementation a memory controller may comprise a buffer to store initialization requests (e.g., in a queue). Once the initialization request is queued, an acknowledgement signals may be promptly provided to a CPU making the initialization request. However, the memory controller may execute an initialization operation satisfying the request expeditiously (e.g., as a write through operation) or less urgently (e.g. as a write back operation).

According to an embodiment, a memory controller may delay execution of an operation to initialize a portion of memory. In one implementation, if the memory controller receives a request to read a page in the portion of an off-chip memory before completion of the requested operation to initialize the portion of memory (e.g., while requested operation to initialize is still in a buffer queue), the memory controller may provide an initialized state without accessing the off-chip memory. In another implementation, if a request for a write operation on a page in the portion of the off-chip memory after the initialization request is received but before the initialization request is completed (e.g., while the initialization request is still in a buffer queue), the memory controller may delay execution of the requested write operation until completion of the requested initialization operation. This may prevent an unintended writing an initialization state over data previously stored in the requested write operation. The comparison logic to check whether a requested read or write operation overlaps with a previous, uncompleted initialization may comprise an inclusion test of addresses.

FIG. 1 is a schematic diagram of a computing system 1 including a processor 2, which may include a general purpose processor, a network processor, an application processor (e.g. as used in mobile telephones), or other types of processor (including a reduced instruction set computer (RISC) processor or a complex instruction set computer (CISC) processor). Furthermore, processor 2 may have a single core or multiple cores.

In the present example, processor 2 comprises local memory 4, depicted as a level 1 (L1) cache 4 for caching data (L1 D) and instructions (L1 I) local to processor 2.

An interconnection or bus 6, hereafter "system bus" 6 couples processor 2 to a controller device 8, which is coupled to a storage device 10, which in the illustrative examples comprises memory 10, via interconnection or bus 12, hereafter "memory bus" 12. In particular implementations, controller device 8 may be implemented as a media controller or a memory controller. In this context, the terms "media controller" and "memory controller" as referred to herein mean a device that facilitates transactions to access a memory or media device. For example, a media controller or memory controller may respond to requests to detect states of or "read" physically addressable portions of a memory or media device corresponding to physical addresses. Also, a media controller or memory controller may respond to request to affect states or "write" to physically addressable portions of a memory or memory device.

Controller device 8 receives read or write requests generated by processor 2, and generates signals to access memory 10 in response to the read or write requests as described below.

Memory 10 comprises control logic to decode the signals received from controller device 8 and provide the read or write access accordingly.

In embodiments, memory 10 comprises a plurality of addressable bitcells. It may be appreciated that a "bitcell" as referred to herein comprises a circuit or portion of a circuit capable of storing a value, symbol, parameter or condition to represent a memory state thereof.

Memory 10 may comprise non-volatile memory such as nanowire memory, ferro-electric transistor random access memory (FeTRAM), magnetoresistive random access memory (MRAM), flash memory, Spin Torque Transfer Random Access Memory (STTRAM), STT magnetic RAM (STTMRAM), 3D cross point memory such as phase change memory (PCM), an SSD with NAND/NOR memory, memory utilising correlated electron material (CEM) etc. In some embodiments, the NVM memory 10 may comprise a storage class memory (SCM).

In other embodiments memory 10 may be a volatile memory, such as a random-access memory (RAM) (e.g. static RAM (SRAM) or dynamic RAM (DRAM)).

Although not specifically depicted, further logic may be provided in computing system 1.

For example, as depicted in FIG. 1, a shared level 2 (L2) cache 14 may be provided between system bus 6 and memory 10, whereby the L2 cache 14 may be used to store data and/or instructions utilized by processor 2.

As a further example, computing system 1 may comprise further storage (not shown), such as a hard-disk drive (HDD), or may comprise additional or alternative bus masters (depicted as bus master(s) 3) which may include one or more of: processor(s), graphics processing unit(s) (GPU), direct memory access (DMA) controller(s) and input/output (I/O) interface(s), although this list is not exhaustive.

Figure 2A:
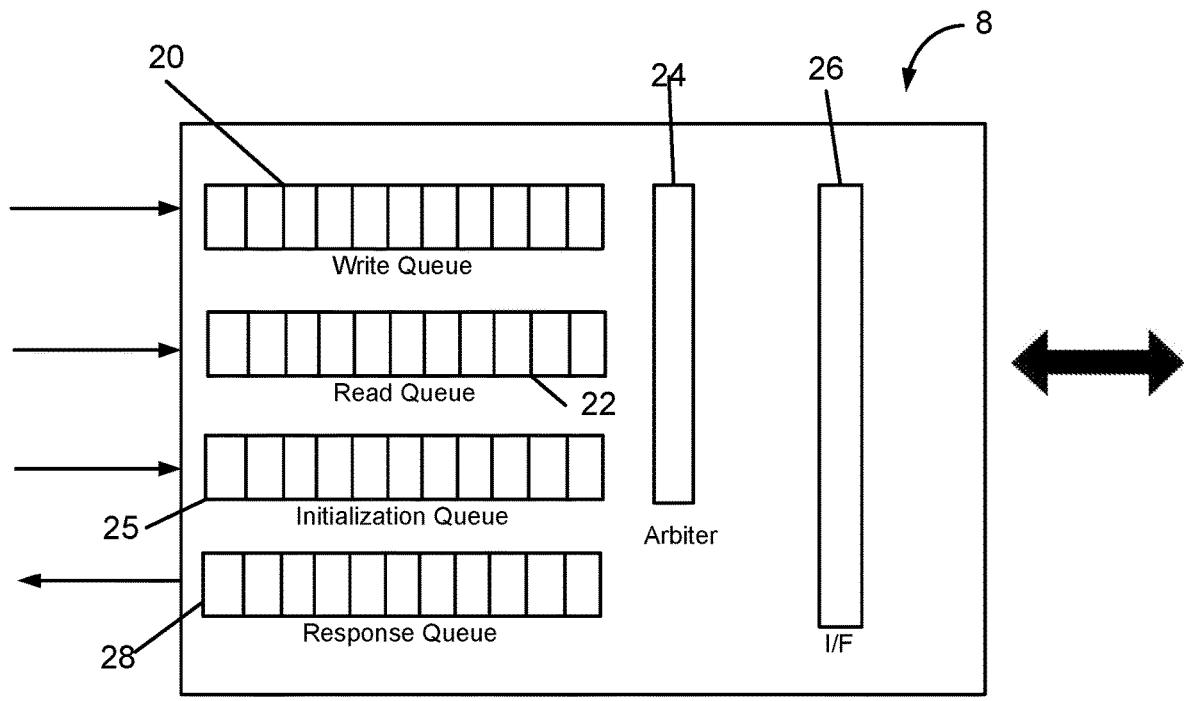
FIG. 2A schematically shows a block diagram of a controller device in accordance with an embodiment.

FIG. 2A schematically shows a block diagram of controller device 8 in accordance with an embodiment, whereby controller device 8 comprises buffers or queues to store the access requests, whereby the access requests may include read/write (e.g. initialisation) requests for a portion of memory, from the processor. In one implementation, controller device 8 may comprise circuitry or logic (e.g., CMOS logic circuitry, field programmable gate array logic or microcontroller logic, or a combination thereof) to implement features described herein. Furthermore, controller device 8 may be implemented as a memory controller and be integrated with a CPU such as CPU as a single device or may be implemented as an "off-chip" device separate from a CPU. Alternatively, controller device 8 may be implemented in as a media controller that is integrated on a device comprising an array of bitcells to be accessed. Features described herein as to particular embodiments of a memory controller or media controller, however, are not limited to any particular implementation of memory controller or media controller, and it should be further understood that claimed subject matter is not limited in this respect.

According to an embodiment, an "operation to initialize a target portion of memory" or an "initialization operation" directed to a target portion of memory refers to a process to place bitcells the target portion of memory in a uniform state. Such a uniform state may comprise the same value, symbol, parameter or condition to all bitcells of the target portion such that all bitcells represent the same memory state. It should be understood that initialization operation may be directed to a target portion of memory of any size such as an addressable page of memory and as small as an addressable cacheline of memory. In one embodiment, a memory controller or media controller may service a single request or command (e.g., originating at a CPU) to initialize a larger portion of memory (e.g., a page) by perform multiple initialization operations directed to smaller portions (e.g., cachelines) making up the larger portion. Additionally, Controller device 8 may receive requests (e.g., originating at CPU 2) to perform operations on memory 10. Controller device 8 may maintain such requests to perform operations on memory 10 in a plurality of buffer queues including, for example, a write queue 20 for queuing requests for write operations, read queue 22 for requests to perform read operations and an initialization queue 25 for requests to perform initialization operations. Controller device 8 may also maintain a response queue 28 of acknowledgement signals to be transmitted (e.g., to CPU 2) to acknowledge receipt or completion of write requests, read requests or initialization requests. In a particular implementation, queues maintained at controller device 8 (e.g., write queue 20, read queue 22, initialization queue 25 and response queue 28) may operate first-in-first-out (FIFO) queues.

According to an embodiment, an arbitration mechanism, depicted as arbiter 24, may determine an order in which the access requests are executed. For example, arbiter 24 may arbitrate an order of access requests between or among access requests in write queue 20, read queue 22 and initialization queue 25 based on one or more of the efficiency, predictability, speed, and flexibility requirements of the system. It should be understood, however, that this list is not exhaustive and arbitration may be performed based other system requirements or user instructions.

Interface (I/F) 26 generates hardware/electrical signals in response to the executed read and write requests. The signals generated by controller device 8 may include, Address signal (A) and data signal (DQ), clock signal (CLK), write enable (WE) signal, read/write (R/W) signal to access the memory as will be understood by a skilled person.

In embodiments using the present techniques, signal interface 26 also generates further signals to initialise a portion of the memory as will be described in greater detail below.

Interface (I/F) 26 may also receive signals (e.g. output signal (RQ) from memory depicted in FIGS. 3A, 4A & 4C-D), and generate a response signal (Rsp) to be transmitted to a bus master. In the present illustrative example, controller device 8 includes a response queue 28 for storing the received signals, whereby response queue 28 may operate as a FIFO.

As pointed out above, particular implementations are directed to enabling a delay in performing an operation initialize a portion of a memory while avoiding corruption of computing operations. For example, particular features are directed to enabling arbiter 24 to delay execution of an operation to initialize an addressable portion of memory 10 (e.g., a page or cacheline) requested by an entry in initialization queue 25. In one implementation, if controller device 8 receives a request to read an addressable portion of an off-chip memory (e.g., a page or cacheline of memory 10) before completion of a requested operation to initialize the portion of memory (e.g., while requested operation to initialize is still in initialization queue 25), controller device 8 may satisfy the requested read operation by returning values according to an initialized state without accessing the off-chip memory. In another implementation, if a request for a write operation on a page in the portion of the off-chip memory is received after the initialization request is received but before the initialization request is completed (e.g., while the initialization request is still in a buffer queue), a memory controller or media controller may delay execution of the requested write operation until completion of the requested write operation. This may prevent an unintended writing an initialization state over data previously stored in the requested write operation.

Figure 2B:
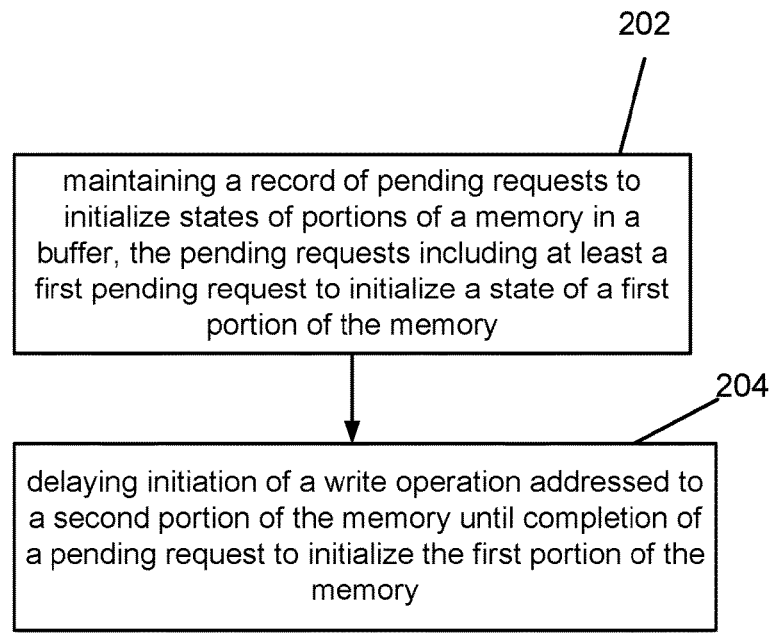
FIG. 2B is a flow diagram of a process according to a particular embodiment.

FIG. 2B is a flow diagram of a process that may enable delay of an operation to initialize a portion of a memory while avoiding corruption of a computing operation according to an embodiment. In a particular implementation, actions in the process of FIG. 2B may be performed, at least in part, by circuitry or logic used to implement controller device 8. Block 202 may comprise maintaining a record in a buffer of pending request to initialize state of a portions of memory. For example, controller device 8 may maintain requests to initialize a first portion of memory 10 in a FIFO queue formed by initialization queue 25. Such a request maintained in initialization queue 25 may specify a time that the request is received or originated (e.g., a time that the request is received on a signal bus from CPU 2 or a time that the request originates at CPU 2) and a portion of a memory that is to be initialized (e.g. a page or cacheline). In one implementation, a request maintained in initialization queue 25 may indicate a portion of memory to be initialized as a range of physical memory addresses such as a target starting address and a range.

Subsequent to receipt of an initialization request maintained at block 202, controller device 8 may receive request for a write operation directed to writing values to a second portion of memory. The second portion of memory may at least partially overlap the first portion of memory to be initialized by the initialization operation requested by the first pending request to initialize the state of the first portion of memory. In one implementation, the received request for the write operation stored in write queue 20 may indicate a time of origination or receipt that is subsequent to a time of receipt or origination of the initialization request indicated in initialization queue 25. For example, time of receipt or origination of requests for the write operation and the initialization operation may be indicated in states of buffers forming write queue 20 and initialization queue 25. Further, controller device 8 may comprise comparison logic to determine whether memory addresses specified in the request for the write operation overlap with memory addresses specified by the previous, uncompleted initialization request maintained at block 202. For example, logic in controller device 8 may implement a test to determine whether any addresses specified by the requested write operation are included in addresses specified by the initialization operation. If there is overlap, controller device 8 may delay initiating execution of the requested write operation until completion of the initialization operation requested by the first pending request to initialize the first portion of the memory. In one embodiment, a memory controller or media controller (e.g., controller device 8) may "initiate" a write operation to a particular portion of a memory by transmitting one or more signals over a bus (e.g., signals transmitted by I/F 26 over memory bus 12). Such signals to initiate a write operation may specify physical addresses of bitcells of the particular portion of memory to be written to and/or values or states to be written to the bitcells. Additionally, "completion" of an operation to initialize a portion of memory may comprise an particular event at which particular bitcells making up the portion of memory are placed in an initialized state (e.g., all "0"s or all "1"s). In one non-limiting example, a memory controller or media controller may determine that an initialization operation has completed based on time elapsed (e.g., clock cycles or memory cycles) following transmission of signals on a memory bus to execute the initialization operation.

In one alternative implementation, in lieu of delaying initiation of a write operation at block 204 memory controller or media controller 8 may merge an operation to write to the second portion of the memory with an operation to initialize the first portion of the memory (satisfying a request to initialize the first portion of the memory). For example, if an address range of the second portion of the memory (specified in the request for the write operation) includes an address range of the first portion of the memory (specified in the request for the initialization operation controller device 8 may remove or save the initialization request). Here, it may be observed that as initialization of the first portion of the memory would be overwritten by the subsequent write operation to the second portion of memory anyway. In another embodiment, if the address range of the second portion of the memory falls inside the address range of the first portion of the memory and if the address range of the second portion of the is greater than half (or another threshold of x %) of the address range of the first portion of the memory, the initialisation request may be serviced using two smaller initialization operations with an address range for an overlap of the first and second portions being removed. If the address range of the second portion of the memory is not greater than half (or another threshold of x %) of the initialisation address range, on the other hand, then block 204 may delay the execution of the write operation until completion of an operation to initialize the first portion of the memory satisfying the pending request to initialize the first portion of the memory.

FIG. 2C is a schematic diagram of features of write queue 20, initialization queue 25 and read queue 22 according to an implementation of controller device 8. According to an embodiment, memory access requests are executed sequentially according to an order such that requests having a lower order are to be serviced before requests having a higher order. As shown in FIG. 2C, an initialization request "D" has an order 0, a read request "E" has an order 1 and a write request "A" has an order 2. An order associated with a particular request in write queue 20, initialization queue 25 or read queue 22 may be determined based, at least in part, on a time of receipt of the order at controller device 8. In the particular example of FIG. 2C, initialization request "D" is scheduled to be performed before read request "E," and read request "E" is scheduled to be performed before write request "A." According to an embodiment, initialization request "D" may be merged with write request "A" under certain conditions such as if read request "E" (having an order that precedes the order of write request "A") does not depend on memory addresses subject to initialization request "D". For example, if read request "E" does not cover any memory addresses covered by initialization request "D," initialization request "D" may be merged with write request "A." If, however, read request "E" covers memory addresses covered initialization request "D," initialization request "D" may not be merged with write request "A."

Assuming, for example, write request "A" has an address range 0x00FF_0000–0x00FF_FFFF (64 KB page), initialization request "D" has an address range of 0x00FF_0000–0x00FF_0FFF (4 KB page) and read request "E" has an address range of 0x00FF_0000–0xFF00_0FFF (4 KB page), there is no overlap between the address range of initialization request "D" and read request "E." As such, initialization request "D" may be merged with write request "A."

In one embodiment, a method, at a controller device, comprises: maintaining a record, in a first buffer, of pending requests to perform operations to initialize states of portions of a memory, the pending requests including at least a first pending request to perform an operation to initialize a state of a first portion of the memory; and conditionally merging a requested write operation with the operation to initialize the state of the first portion of the memory request, the write operation being addressed to a second portion of the memory within the first portion of the memory, in the absence of a request to perform a read operation to precede the write operation. In one particular implementation, the read operation is addressed to a third portion of the memory at least partially overlapping the portion of the memory. In another particular implementation, the method further comprises comparing an address range of the third portion of the memory with an address range of the portion of the memory to determine whether the third portion of the memory at least partially overlaps the portion of the memory.

In another embodiment, a controller device comprises: a first buffer to maintain a record of pending requests to initialize states of portions of a memory, the pending requests including at least a first pending request to initialize a state of a first portion of the memory; and circuitry configured to conditionally merge a requested write operation with the operation to initialize the state of the first portion of the memory, the write operation being addressed to a second portion of the memory within the first portion of the memory, in the absence of a request to perform a read operation to precede the write operation. In one particular implementation, the read operation is addressed to a third portion of the memory at least partially overlapping the portion of the memory. In another particular implementation, the circuitry is further configured to compare an address range of the third portion of the memory with an address range of the portion of the memory to determine whether the third portion of the memory at least partially overlaps the portion of the memory.

Figure 2D:
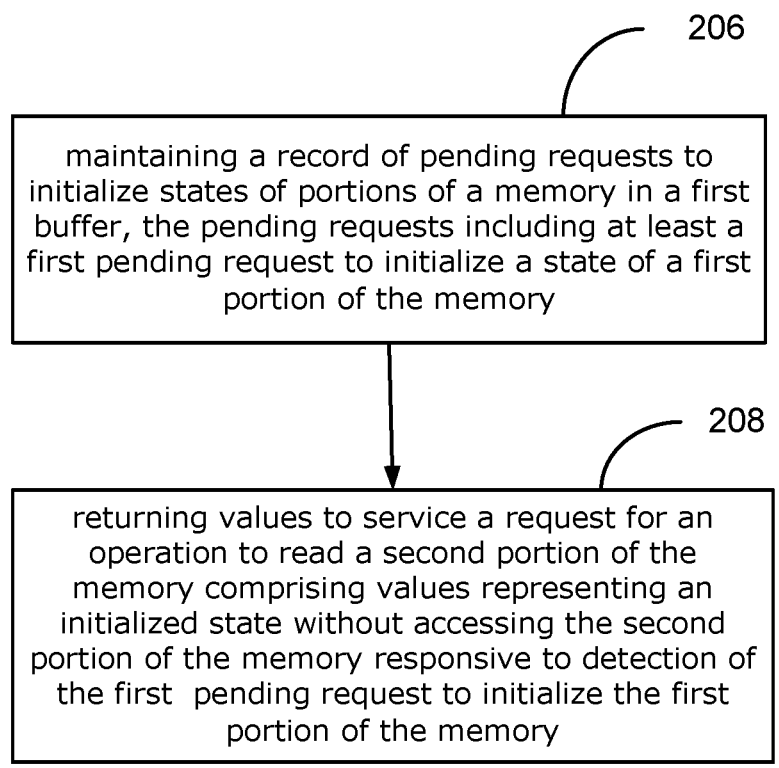
FIG. 2D is a flow diagram of a process according to a particular embodiment.

FIG. 2D is a flow diagram of a process that may enable delay of an operation to initialize a portion of a memory while avoiding corruption of a computing operation according to a second embodiment. In a particular implementation, actions in the process of FIG. 2D may be performed, at least in part, by circuitry or logic used to implement controller device 8. Like block 202 as described above, block 206 may comprise maintaining a record in a buffer of pending request to initialize state of a portions of memory including a first pending request to initialize a state of a first portion of a memory (e.g., page or cacheline of memory 10). A memory controller or media controller may subsequently receive a request for an operation to read a second portion of a memory such as memory 10. For example, controller device 8 may receive the request to read the portion of memory and store the request in read queue 22. A request stored in read queue 22 may indicate a time of origination or receipt of the request that is subsequent to a time of receipt or origination of the first pending request to initialize the state of the first portion of the memory (e.g., as indicated in initialization queue 25). According to an embodiment, controller device 8 may comprise comparison logic to determine whether memory addresses specified in the request for the read operation overlap with memory addresses specified by a previous, uncompleted initialization request (e.g., as maintained in a buffer at block 206). For example, logic in controller device 8 may implement a test to determine whether addresses specified by the requested read operation are included in addresses specified by the initialization operation. If there is overlap, controller device 8 at block 208 may return values to service the request for the read operation comprising values representing an initialized state (e.g., all "0"s or "1"s for bits in the range of the read request) without accessing the particular portion of the memory.

In an embodiment, accessing a portion of a memory in the course of a read operation may comprise, among other things, transmitting signals on a memory bus (e.g., transmitting signals by I/F 26 on memory bus 12) indicating address associated with bitcells in the portion of the memory. In a particular implementation, controller device 8 may service a read request at block 208 without accessing memory 10 (e.g., without transmitting signals on memory bus 12 indicative of physical addresses of bitcells in a portion of memory to be read). Here, controller device 8 may comprise logic or circuitry to automatically generate signals for a message on system bus 6 for returning values (e.g., according to an initialized state) at block 208 to service the request for the read operation without attempting to access memory 10 through memory bus 12. For example, controller device 8 may, in response to determining an overlap of memory addresses specified in a previous request to initialize a first portion of memory 10 and a request to read a second portion of memory 10 received at block 206, controller device 8 at block 208 may generate signals for a message on system bus 6 comprising initialised values or states (e.g., all "0"s or "1"s) corresponding to addresses or bitcells in the second portion without accessing physical bitcells in memory 10 through memory bus 12 (e.g., without interaction between I/F 26 and memory 10).

Figure 3A:
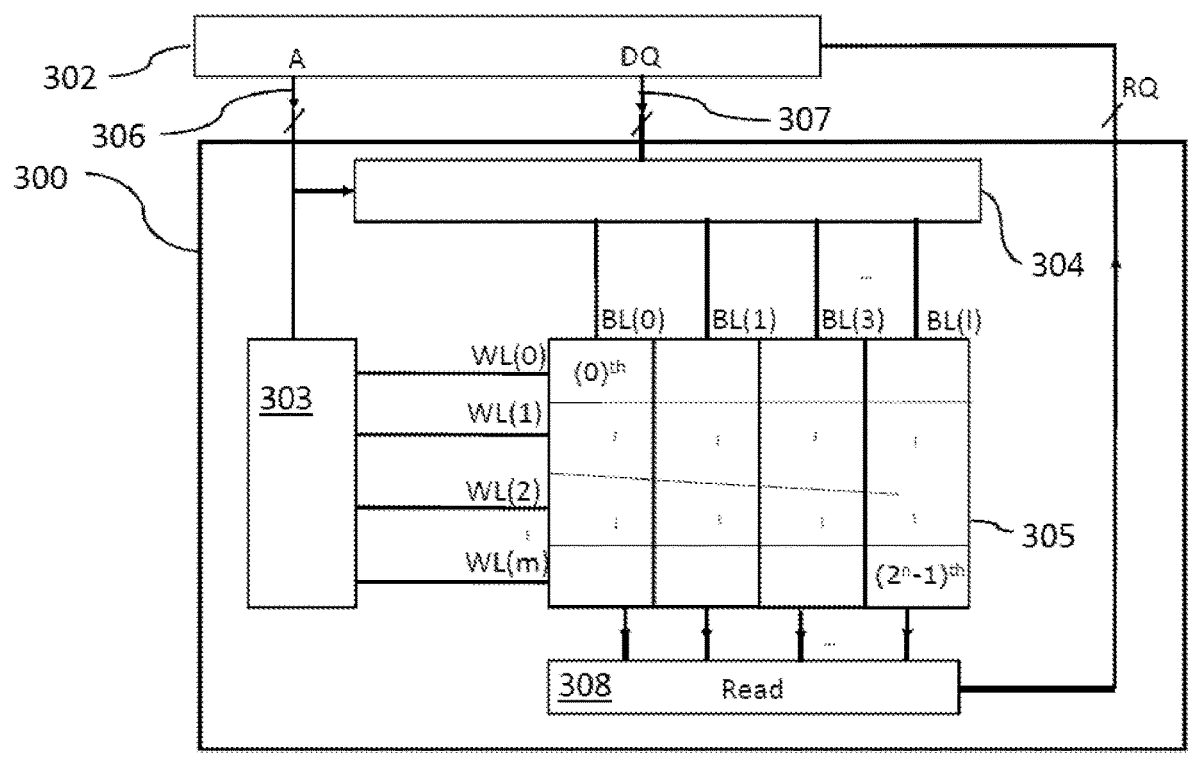
FIG. 3A is a schematic block diagram of a memory and controller device according to an embodiment.
Figure 3B:
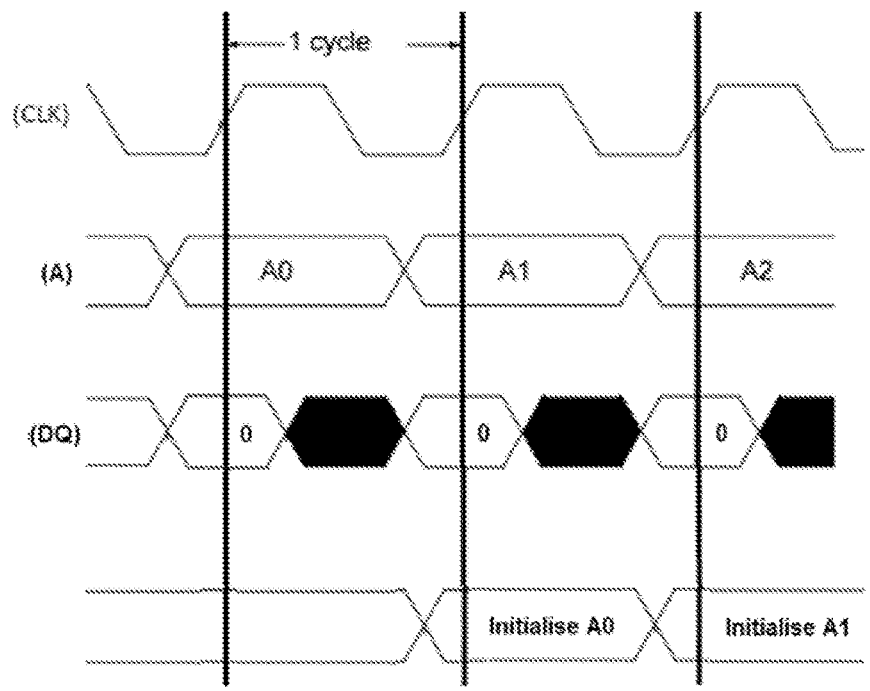
FIG. 3B schematically shows a timing diagram for initialising a portion of a memory according to an embodiment.

FIG. 3A schematically shows a block diagram of memory 300 and media controller 302 according to a particular embodiment of memory 10 and controller device 8, respectively, while FIG. 3B schematically shows a timing diagram for initialising a portion of memory 300.

In an embodiment, memory 300 comprises control logic 303, 304 to decode one or more of the signals received from media controller 302.

Memory 300 further comprises a plurality of bitcells, which in the present illustrative example are arranged in a bank or array 305 comprising 'm' rows and 'l' columns, whereby each bitcell has a unique physical address associated with the intersection of a row and column, whereby the rows of bitcells are coupled to and addressable via respective signal lines arranged as wordlines WL(0) to WL(m), whilst the column of bitcells are coupled to and addressable via respective signal lines arranged as bitlines BL(0) to BL(l).

Memory 300 further comprises read logic 308 to determine the memory state of the bitcell(s), and generate an output (RQ) accordingly.

In the present arrangement, to initialise bitcells of a wordline of memory, and as depicted in FIG. 3B, media controller 302 generates an address signal (A0) to identify a first target bitcell or word to be initialised, whereby the address signal is provided on address bus 306 in a first clock cycle, whereby the target bitcell may be the first bitcell of a word on a first wordline.

Media controller 302 also provides the data signal (DQ) on data bus 307, whereby the data signal (DQ) defines the memory state to be stored or written to the first target bitcell.

As depicted in FIG. 3B, on decoding the address and data signal, control logic 303, 304 drives the respective wordline and bitline and to store the decoded memory state of (DQ) in the first target bitcell or bitcells of the word during a first clock cycle.

Media controller 302 may repeat the operation for each of the remaining addresses in the portion of memory to be initialised, with an address (A1, A2 etc.) being sent from media controller 302 to control logic 303, 304 in consecutive clock cycles as depicted in FIG. 3B.

It will be appreciated, therefore, that initialising different bitcells or words may comprise a serial operation performed over multiple clock cycles, with data being stored in one bitcell or word per clock cycle.

With that in mind, initialising a portion of memory (e.g., a 32 kb of memory) over multiple clock cycles may result in an application stalling until the initialisation of that portion of memory is complete, which may result in processing delays in the system 1.

Furthermore, writing a memory state to a bitcell will incur a write current. Taking STT-MRAM as an illustrative example, writing a memory to a bitcell of STT-MRAM draws approximately 1.0 mA, whereby the current drawn will increase dependent on the number of bitcells being written to over the same clock cycle.

As an illustrative example, writing a memory state to multiple bitcells comprising 32 kb of STT-MRAM memory during a single clock cycle will draw approximately 32 Å.

Writing to a similar size portion (e.g., 32 kb) of other types of NV memory such as Flash memory or PCM over the same clock cycle may draw currents of similar magnitude, such that the number of bitcells written to over any one clock cycle is controlled to be one word or less depending on the application.

Figure 4A:
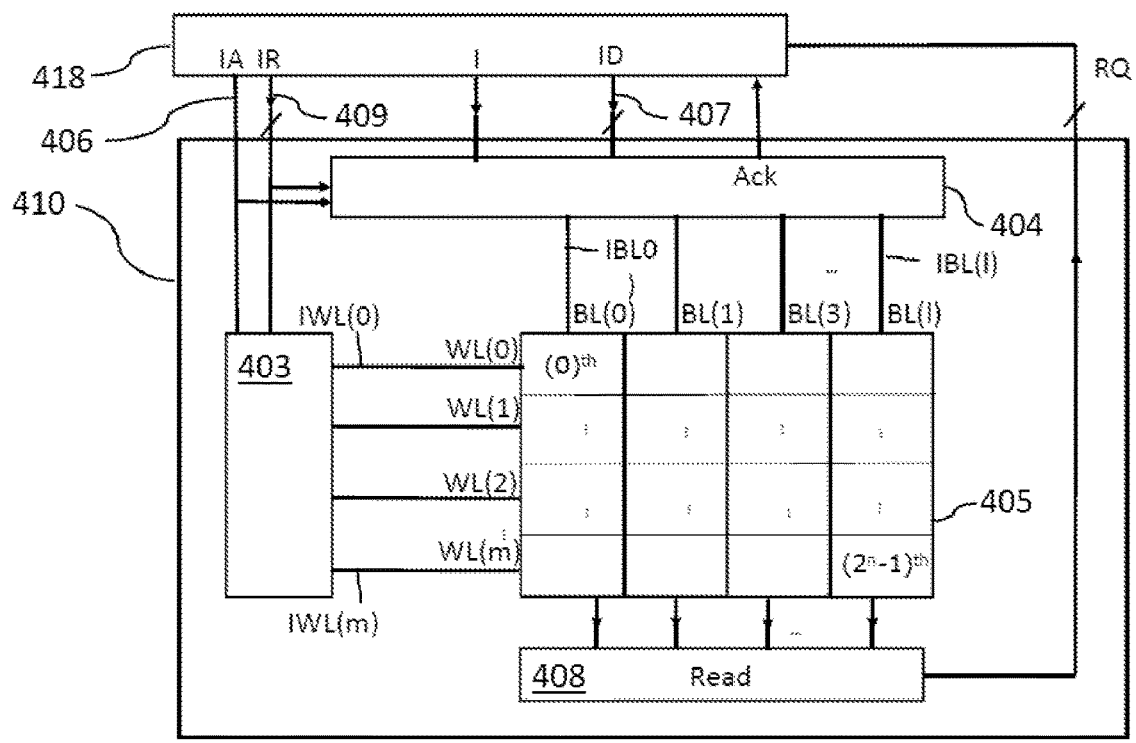
FIG. 4A is a schematic diagram of a controller device and a memory according to an embodiment.
Figure 4B:
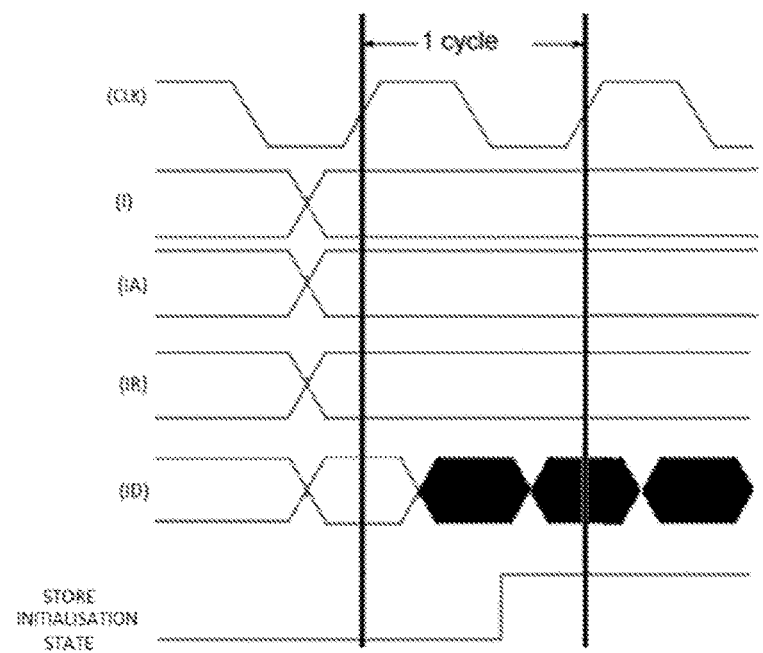
FIG. 4B schematically shows a timing diagram for initialising a portion of the memory of FIG. 4A.

FIG. 4A schematically shows a block diagram of media controller 418 and memory 410 according to another particular embodiment of controller device 8 and memory 10, respectively, whilst FIG. 4B schematically shows a timing diagram for initialising a portion of memory 410 in an initialization operation over a clock cycle.

In the present illustrative example, memory 410 comprises a plurality of bitcells, which in the present illustrative example are arranged in a bank or array 405 comprising 'm' rows and 'l' columns, whereby, as above, each bitcell has a unique address defined by the intersection of a row and column, whereby the rows of bitcells are coupled to, and addressable via respective first signal lines, arranged as wordlines WL(0) to WL(m) in the present illustrative example, whilst the column of bitcells are coupled to and addressable via second signal lines arranged as bitlines BL(0) to BL(l).

In the context of the present disclosure, a signal line comprises a conductor for transmitting a signal, whereby a "wordline" transmits a signal to select the one or more bitcells in a read operation or a write operation (e.g. an initialization operation), whilst a "bitline" transmits a signal for controlling or driving one or more bitcells to alter a memory state thereof in a write operation, or to sense a memory state thereof in a read operation.

As above, media controller 418 may be configured to generate hardware/electrical signals, such as address signals (A) and data signals (DQ) to initiate a read or write access to one or more target bitcells in the array 405, in response to access requests from a bus master (not shown).

Media controller 418 may be further configured to generate one or more initialisation signals comprising an initialise address (IA) signal, an initialise range (IR) signal (wherein the IA and IR signals specify a range of memory locations/bitcells to be initialized in an initialization operation), and an initialise data (ID) signal, which comprise hardware/electrical signals generated in response to instructions from a bus master. In the particular implementation discussed above in connection with FIG. 2B, media controller 418 may respond to a request for a write operation by delaying the write operation until following generation of initialization signals IA, ID and ID to control logic 404. Furthermore, in the particular implementation discussed above in connection with FIG. 2D, media controller 418 may respond to a request for a subsequent read operation prior to generation of initialization signals IA, ID and ID according to block 208.

In some embodiments, media controller 418 may generate an initialise (I) signal, indicative of a command for memory 410 to perform an initialisation operation. For example, the initialise signal (I) may comprise encoded bit(s) which the memory 410 decodes and recognises as a command to initialise a portion of memory 410. However, in alternative embodiments, memory 410 may recognise one or more of the initialise address (IA) signal, initialise range (IR) signal and initialise data (ID) signal as a command(s) to initialise a portion of memory 410. For example, the initialise (I) signal could be encoded in one of these signals, such as in the lowest bits in the initialise address (IA) signal.

In the present illustrative example, the initialise address (IA) signal, comprises a first or start address of the target portion, whereby the first address may refer to a bitcell, a word or a wordline.

The initialise range (IR) signal specifies the addresses up to a final or end address for the target portion, whereby the range may begin at the first address. In examples, the initialise range (IR) signal may be an offset value used to specify all addresses in the range from the first address to last address. In embodiments the addresses of the target portion are consecutive bitcell addresses.

It will be appreciated that the range may specify a portion of memory, such as a word, a part of a page, one or more pages or an array up to the whole memory.

In examples, the initialise address range (IR) signal may comprise one or more bits provided on a single input line to memory 410. In other examples, the initialise address (IR) range signal may be provided on a bus line such as range bus 409.

The initialise data (ID) signal specifies a particular value, symbol, parameter or condition to be stored in the bitcells of the target portion to represent a memory state as an "initialisation state", of the bitcells thereof, whereby control logic 403, 404 decoding the received initialise data (ID) signal will store the initialisation state to the bitcells of the target portion.

In embodiments, the initialise data (ID) signal may be provided on a single input line to memory 410, or on a bus line such as the data bus 407. In further embodiments, the initialise data (ID) signal may be the data (DQ) signal and/or provided on data bus 407 (shown above in FIG. 3A). In further examples the initialise data (ID) signal may be optional, whereby a default initialisation state (e.g. all '1's or '0's) may be written to one or more of the bitcells during an initialisation operation when the memory 410 recognises a received signal as command to initialise a portion of memory 410. Such a received signal may include the initialise signal (I), the initialise address (IA) signal and initialise range (IR) signal.

In operation, media controller 418 may receive access requests from a bus master to initialise a target portion of memory 410.

In response to the access request, and as depicted in FIG. 4B, media controller 418 generates an initialise (I) signal, indicative of a command for memory 410 to perform an initialisation operation. As above, the initialise (I) signal is optional. Media controller 418 may also generate an initialise address (IA) signal specifying a first address of a target portion, and an initialise range (IR) signal, specifying all addresses of the target portion to be initialised.

Media controller 418 may further generate an initialise data (ID) signal, which specifies the initialisation state to be stored in the bitcells of the target portion. As above, the initialise data (ID) signal may be optional, whereby in alternative examples a default initialisation state (e.g. all '1's or '0's) may be written to one or more of the bitcells during an initialisation operation when the memory 410 recognises a received signal as command to initialise a portion of memory 410.

Control logic 403 and 404 may receive and decode the initialise signal (I), the initialise address signal (IA) and the initialise range (IR) signal to identify the bitcells of the target portion, and decodes the initialise data signal (ID) to identify the initialisation state to be stored therein.

Control logic 403 and 404 may then generate initialise wordline signals (IWL) to select the respective bitcells and initialise bitline signals (IBL) and control or drive the selected bitcells to store the required initialisation state therein over the same clock cycle (e.g., on the rising edge of the clock signal (CLK)).

Therefore, in contrast to the arrangement of FIG. 3A, multiple bitcells on different wordlines may be initialised over the same clock cycle.

As discussed above, the time to initialise sufficient memory to start applications (e.g., following a boot, or a request by an application) is growing rapidly as memory capacity and application demand increases. Therefore, initialising a portion of memory in a single clock cycle means that a boot process or initialisation of a portion of memory for an application may be performed faster in comparison to the prior art arrangement of FIG. 3A, which is performed over many multiple clock cycles.

Whilst FIG. 4B depicts the initialisation signals (I), (IA), (IR) and (ID) as being generated over the same cycle, this is for illustrative purposes only, and these signals may be generated during different clock cycles. Furthermore, whilst FIG. 4B depicts the initialisation operation being performed in the clock cycle immediately following generation of the initialisation signals, the initialisation operation may be performed any number of clock cycles following generation of the initialisation signals. It will be appreciated that the clock signal may be generated by PLL (phase-locked loop), CDR (clock-data recovery), or any suitable generation means.

In embodiments, the memory 410 may generate an acknowledgement signal (ACK) to confirm that the initialisation operation was initiated and/or completed. Such an acknowledgment may be performed after the read logic verifies the initialisation state of the target bitcells.

Figure 4C:
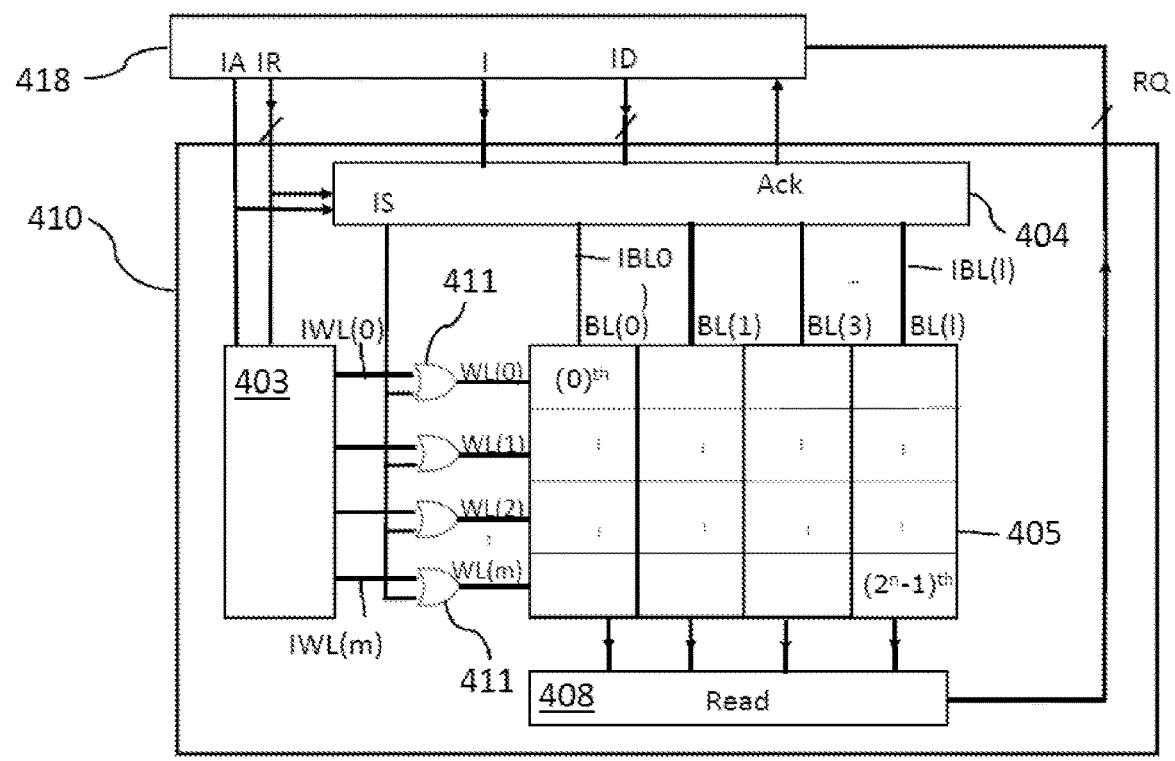
FIGS. 4C and 4D schematically show diagrams of a controller device and a memory according to embodiments using the present techniques.

FIG. 4C schematically shows a block diagram of media controller 418 and memory 410 according to a further embodiment.

Media controller 418 and memory 410 are similar to those described above in FIG. 4A, whereby control logic 403 and 404 decodes initialisation signals (e.g., initialise (I) signal, the initialise address (IA) signal and the initialise range (IR) signal) to identify that an initialisation operation is required, and to identify the target portion to be initialised, and decodes the initialise data (ID) signal to identify the initialisation state to be stored in the target bitcells thereof.

In the present illustrative embodiment, memory 410 may comprise further logic, in the form of logic gates, the output of which is used to select a respective wordline, whereby, in the present illustrative example, logic gates comprise 'OR' gates 410.

As described above in FIGS. 4A & 4B, control logic 203 and 204 can, by generating initialisation wordline signals (IWL) select the wordlines having the target bitcells coupled thereto, and by generating initialise bitline signals (IBL) control or drive the bitlines to write or store an initialisation state to the target bitcells coupled thereto, with the initialise wordline signals (IWL) used as first inputs to the respective logic gates in the present embodiment.

Furthermore, control logic 404 depicted in FIG. 4C generates an initialise select (IS) signal, based, at least in part, on one or more of the initialisation signals (e.g. (I), (IA), (IR), (ID)), whereby the initialise select (IS) signal is used as a second input to respective logic gates 410, to, when asserted, cause all logic gates 410 to select all the respective wordlines.

An initialisation state specified by the initialise data (ID) signal can then be written to all the target bitcells by controlling the bitlines, based, at least in part, on the decoded initialise data (ID) signal.

Therefore, the output of logic gates 410 may be used to select one or more of the wordlines individually using the respective initialise wordline signals (IWL) generated based, at least in part, on the initialise address (IA) signal and/or the initialise range (IR) signal.

Alternatively, logic gates 410 may be used to select all the wordlines in array 405 substantially simultaneously in response to the (IS) signal, rather than requiring control logic 403 to generate individual initialise wordline (IWL) signals.

Such functionality may decrease the time taken to initialise a plurality of target bitcells than would otherwise have taken.

Figure 4D:
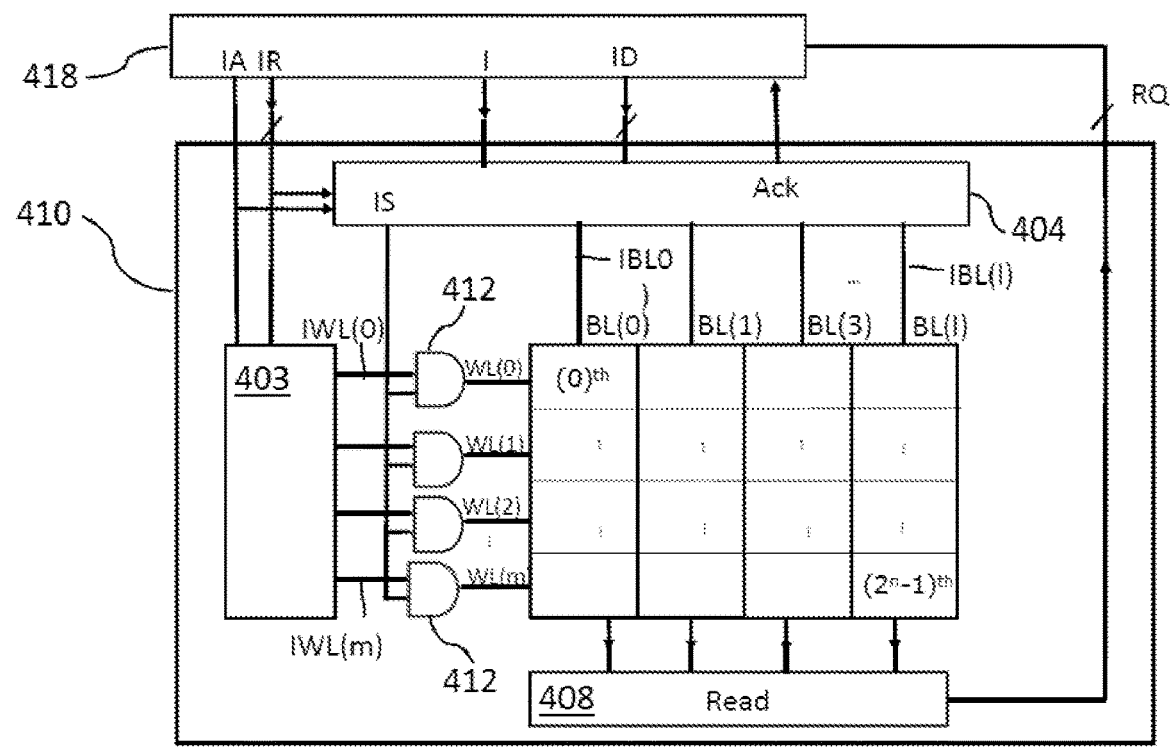

FIG. 4D schematically shows a block diagram of media controller 418 and memory 410 according to a further embodiment. Media controller 418 and memory 410 may be similar to those described above in FIG. 4C.

The logic gates of FIG. 4D comprise 'AND' gates 412, with the initialise wordline signals (IWL) used as a first input to the respective AND gates 412 on the respective wordlines.

In the present embodiment, control logic 404 may also generate an initialise select signal (IS), based, at least in part, on one or more of the initialisation signals (e.g. (I), (IA), (IR), (ID)), whereby (IS) is provided as a second input to the AND gates 310, such that a target wordline will only be selected when the initialise select (IS) signal is asserted and one or more initialise wordline signals (IWL) are asserted by control logic 403 and 404.

Therefore, in the present embodiment, the (IS) signal may be used as a control signal, whereby the initialisation state of a particular bitcell(s) will only be stored or written when (IS) and the corresponding initialisation wordline signal (IWL) are asserted.

Such functionality may prevent writing erroneous initialisation states to non-target bitcells.

Whilst logic gates 411 and 412 in FIGS. 4C & 4D are depicted as OR and AND gates respectively, the claims are not limited in this respect, and the logic gates may comprise one or more logic gates arranged to provide any logic operation (e.g. NOR, NAND, NOR etc.).

As described above, memory 410 may be a volatile memory or non-volatile (NV) memory, whereby the NV memory may comprise a storage class memory (SCM).

Figure 5:
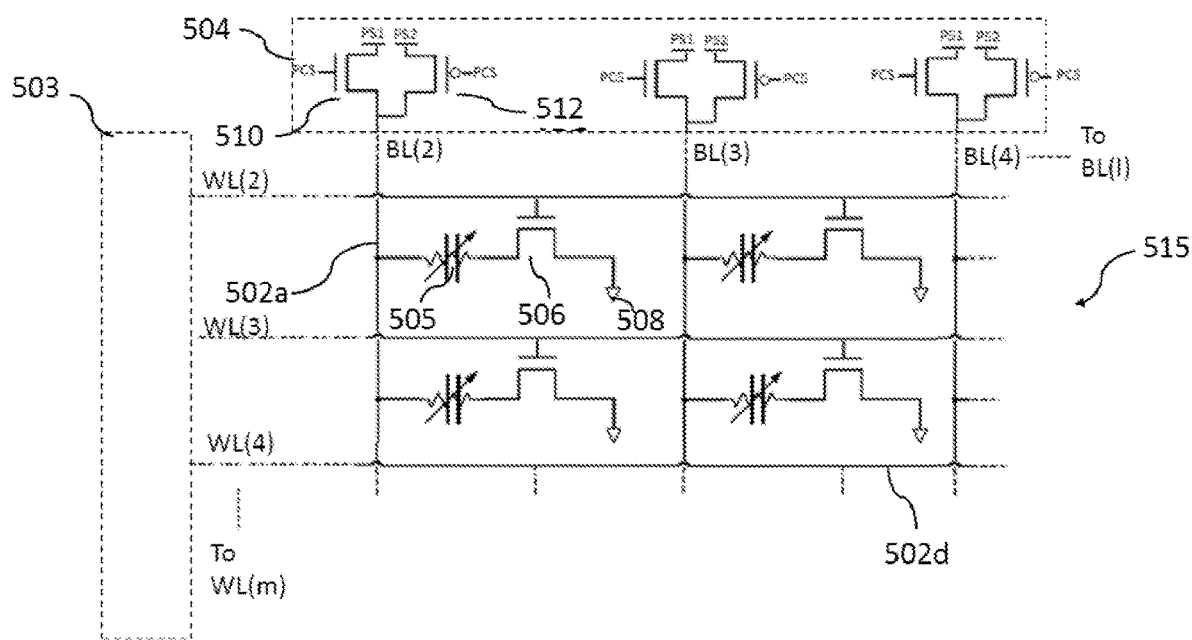
FIG. 5 schematically shows an architecture for a memory array according to an embodiment using the present techniques.

FIG. 5 is a schematic diagram of example architecture for memory array 405 of FIGS. 4A to 4D above.

As above, memory array 515 comprises a plurality of bitcells 502 (four of which 502a-d are depicted in FIG. 5), arranged in rows (m) and columns (l) and which may be addressed by control logic 503 and 504 as previously described.

In the present illustrative example, each bitcell 502a-d comprises a storage element 505 coupled between a respective bitline and a first terminal of a conducting element 506, whilst a second terminal of conducting element 506 is coupled to a reference node 508.

In the present illustrative example, a third terminal (e.g., gate terminal) of conducting element 506 is coupled to a respective wordline, whereby an operating state of the conducting element may be controlled via the respective wordline.

In the context of the present disclosure, a "conducting element" comprises a circuit element capable of controlling the flow of current between the first and second terminals thereof, depending on the operating state thereof which, as above, maybe controlled via its third terminal. For example, when in an "on" or "closed" state conducting element 506 permits current to pass between its first and second terminals, whilst in an "off" or "open" state the conducting element 506 prevents substantially all current from passing between its first and second terminals.

Furthermore, a "reference node" comprises a node in a circuit that is maintained at a particular voltage level or at a particular voltage difference from another node in the circuit. In one example, the reference node 508 may comprise or be connected to a ground node. In other particular implementations, the reference node 508 may be maintained at a particular voltage relative to that of a ground node.

In the illustrative example depicted in FIG. 5, the storage element 505 comprises a correlated electron switch (CES) having a correlated electron material (CEM) sandwiched between conductive terminals.

The CES may be placed in a first impedance state comprising a low impedance or conductive state, by application of a first programming signal (PS1) comprising a first voltage ($V_{SET}$) at a first current density ($J_{SET}$)(J (A/µm$^2$)) across its conductive terminals, whereby the first impedance state represents a first memory state of the bitcell.

The CES may also be placed in a second impedance state comprising a high impedance or insulative state, by application of a second programming signal (PS2) comprising a second voltage ($V_{RESET}$) at current density ($J_{RESET}$) across its conductive terminals, whereby the second impedance state represents a second memory state of the bitcell. In embodiments, $|V_{SET}|>|V_{RESET}|$ and $|J_{RESET}|>|J_{SET}|$.

In context of the present disclosure, an "impedance state" means a detectable impedance state of the CES that represents a memory state of the associated bitcell.

Furthermore, it should be understood that the terms "low impedance state" and "high impedance state" are relative terms and not specific to any particular value for impedance, conductance or capacitance. For example, whilst in a low impedance state the CES may be more conductive (or less insulative), than while the CES is in a high impedance state.

The programming signal (PS1 or PS2) to place a CES in a particular impedance state may be generated or supplied by control logic 204 via the respective bitlines. Furthermore, both the voltage (V) and current density (J) of the programming signal may be controlled (e.g. by the control logic) to switch the impedance state of the CES. For example, when the CES is in a first impedance state, and voltage ($V_{RESET}$) is applied, the CES will not switch to the second impedance state until the current density is at the required value of ($J_{RESET}$).

In the present illustrative example, the programming signal (PS1) or (PS2) is applied to the respective bitlines via conducting elements 510 and 512 when the corresponding wordlines are selected by control logic 503, whereby, in the present illustrative example, the operating state of conducting elements 510 and 512 is controlled using programming control signal (PCS), which may be generated at the control logic 504 based, at least in part, on an initialisation data (ID) signal from media controller 504, or the programming control signal (PCS) may be based on a default initialisation state to be written to one or more of the bitcells.

The conducting elements 510 and 512 may be transistors such as a field effect transistors (FET). In the illustrative example of FIG. 5, conducting element 510 is an nFET, whilst conducting element 512 is a pFET, such that when PCS is high (e.g. logic 1), conducting element 510 is in a closed or "on" state and conducting element 512 is in an open or "off" state, such that first programming signal (PS1) is applied to a target CES.

Similarly, when PCS is low (e.g. logic 0), conducting element 512 is in a closed or "on" state and conducting element 510 is in an open or "off" state such that the second programming signal (PS2) is applied to a bitline of a target CES.

It will be understood therefore that the impedance state of one or more of the CESs may be controlled by applying the first or second programming signals (PS1 or PS2) thereto based, at least in part, on an initialisation data (ID) signal from media controller 504.

In typical operation, the write current when writing to a bitcell comprising a CES storage element using the first programming signal (PS1) or second programming signal (PS2) is reduced in comparison to writing to a bitcell of other types of memory such as STT-MRAM.

Therefore, it will be appreciated that it is possible to write to or initialise large numbers of CES storage elements during a single cycle with reduced write current in comparison to other storage types.

It will be understood that conducting elements 506, 510 and 412 described above are not necessarily limited to being FETs and may be any suitable type of transistor such as a bipolar junction transistor (BJT). It will also be understood that the conducting elements 406, 410, 412 are also not limited to being transistors, and other types of devices such as diodes, variable resistor, etc. may be used as a conducting element, and that the claimed subject matter is not limited in this respect.

It will also be understood that the present architectures are provided as illustrative examples only, and any suitable architecture for the memory array may be used. For example, the array 515 is not limited to having CES storage elements in the arrangement depicted in FIG. 5, but the techniques may be used with different storage elements arranged to store a value, symbol, parameter or condition as a memory state of the associated bitcell. As an illustrative example, a storage element 505 may comprise one or more resistors (e.g. a variable resistors), one or more capacitors and/or one or more transistors arranged to store a value, symbol, parameter or condition as a memory state of the associated bitcell.

Figure 6:
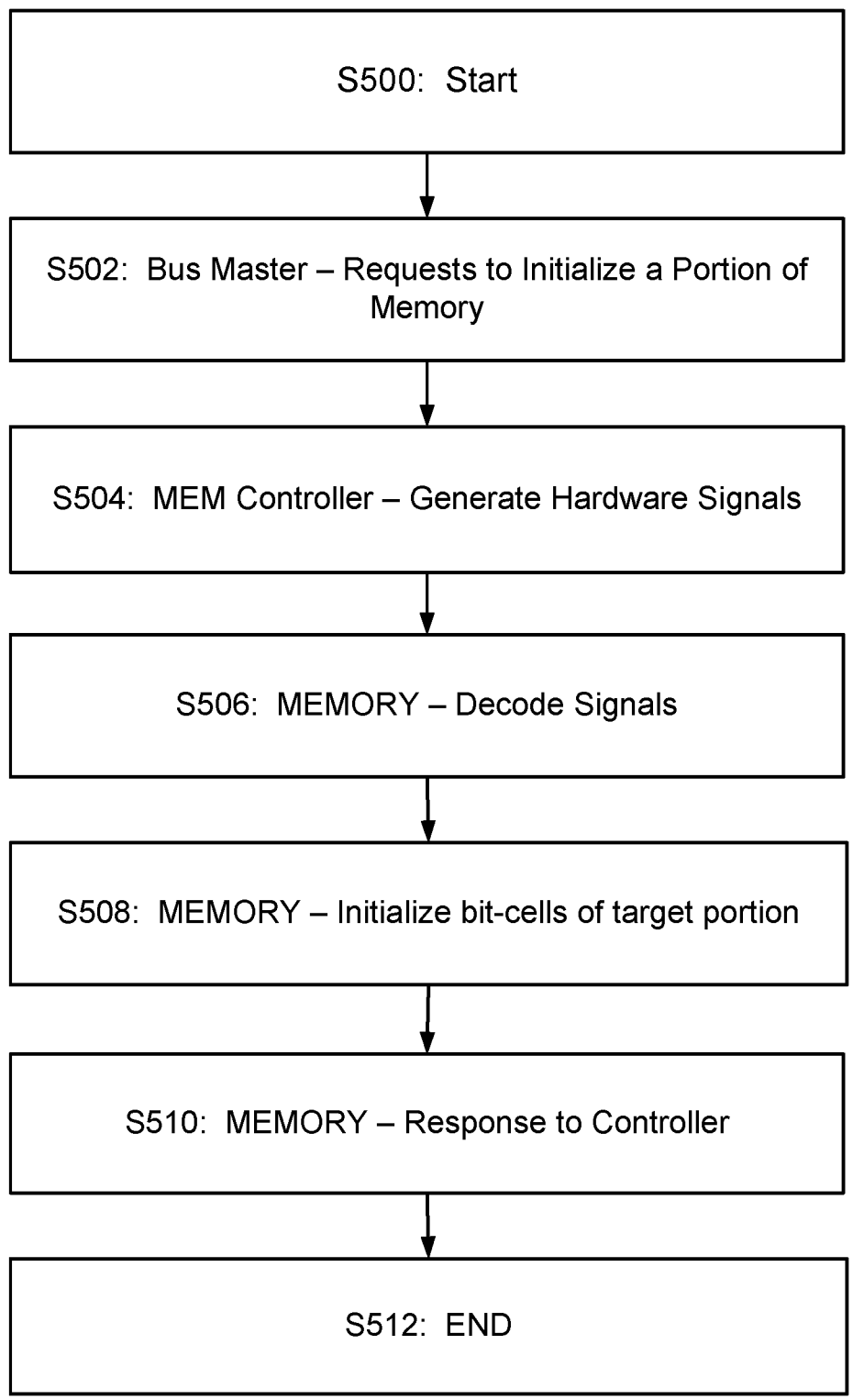
FIG. 6 shows an example flow diagram showing the process of initialising a portion of memory according to an embodiment.

FIG. 6 shows an example flow diagram showing the process of initialising a portion of memory.

At Step S500 the process starts.

At Step S502, a bus master, such as a processor, generates software instructions specifying an access request to initialise a portion of memory (e.g. word, page, whole array, whole of memory etc.), and transmits the instructions to a memory controller or media controller. As above, in the context of the present disclosure, initialisation of a portion of memory generally refers to the process of writing the same value, symbol, parameter or condition to all the bitcells of the target portion such that all bitcells represent the same initialisation state.

At step S504, the memory controller or media controller translates the software instructions into hardware/electrical signals and transmits the signals to memory.

In the present embodiment, the hardware signals comprise an initialise (I) signal, an initialise address (IA) signal comprising an address of the portion to be initialised, an initialise range (IR) signal specifying the range of addresses in the portion of memory to be initialised, and an initialise data (ID) signal specifying the initialisation state to be written to the specified bitcells.

At step S506, control logic in the memory decodes the hardware signals from the memory controller or media controller, and at step S508 selects the appropriate wordlines, and writes an initialisation state to the bitcells of the target portion based, at least in part, on the initialise data (ID) signal.

The bitcells comprise storage element(s) for storing a value, symbol, parameter or condition as a memory state of the associated bitcell. In embodiments the storage element(s) comprise CES(s), whereby initialising a CES means applying a programming signal to place the CES in a high- or low-impedance state based, at least in part on, the initialise data (ID) signal. Using CES as storage elements in the array reduces the write current in comparison to other types of storage elements such as STT-MRAM, NAND or NOR Flash, etc.

At step 510, the control logic optionally generates an acknowledgement signal (ACK) to confirm that the initialisation operation was initiated and/or completed.

At step 512 the process ends.

Particular embodiments discussed above are directed to a method comprising: maintaining a record of pending requests to initialize states of portions of a memory in a first buffer, the pending requests including at least a first pending request to initialize a state of a first portion of the memory; and returning values to service a request for an operation to read a second portion of the memory comprising values representing an initialized state without accessing the second portion of the memory responsive to detection of the first pending request to initialize the first portion of the memory. In one particular implementation, accessing the second portion of the memory comprises transmitting one or more signals on a memory bus connected to the memory indicating physical addresses corresponding to the second portion of the memory. In another particular implementation, the method further comprises returning values to service the request for the operation to read the second portion of the memory responsive to a determination that the request for the operation to read from the second portion of the memory was originated or received following origination or receipt of the first pending request to initiate the state of the first portion of the memory. In another particular implementation, the method further comprises determining that the request to read the second portion of the memory was originated or received following origination or receipt of the first pending request to initiate the state of the first portion of the memory based, at least in part, on states of the first and second buffers. In another particular implementation, the request to read from the second portion of the memory is received from a processing unit subsequent to receipt of the pending request to initialize the particular portion of the memory. In another particular implementation, the first portion of the memory comprises bitcells corresponding with a first range of physical memory addresses and the second portion of the memory comprises bitcells corresponding with a second range of physical memory addresses, and the method further comprises returning values to service the request for the operation to read the second portion of the memory responsive to an overlap of the first range of physical memory addresses and the second range of physical memory addresses.

In the preceding description, various details are described to provide an understanding of various embodiments. However, it will be appreciated that various embodiments may be practiced without the specific details.

In other instances, well-known methods, procedures, components, and logic have not been described in detail so as not to obscure the particular embodiments. Furthermore, various aspects of embodiments may be performed using various means, such as hardware (e.g. circuits, such integrated semiconductor circuits), software (e.g. computer program code), or some combination of hardware and software.

For the purposes of this disclosure reference to "logic" shall mean either hardware, software, or some combination thereof.

As mentioned above, and as depicted in FIG. 5, the storage elements of the bitcells of array 505 may comprise a CES. In this context, a CES may exhibit an abrupt conductor/insulator transition from a low impedance (and low capacitance) state to a high impedance (and high capacitance) state, or vice versa, arising from electron correlations in the CEM rather than solid state structural phase changes (e.g., crystalline/amorphous changes as occurs in phase change memory (PCM) devices or filamentary formation as occurs in resistive RAM devices).

In embodiments, the abrupt conductor/insulator transition in a CEM may be responsive to a quantum mechanical phenomenon, in contrast to melting/solidification or filament formation. Such a quantum mechanical transition between impedance states in a CES may be understood in any one of several aspects.

In embodiments, the quantum mechanical transitions between first and second impedance states may be understood in terms of Mott transitions. For example, a CEM may switch from a high impedance state to a low impedance state when a first Mott transition condition is met and may switch from a low impedance state to a high impedance state when a second Mott transition condition is met. The different Mott transition conditions will be described in further detail below.

In one aspect, the impedance of the CES in the second impedance state may be more than 100 times greater than the impedance of the CES in the first impedance state.

In an embodiment, the CEM comprises a switching region (S) arranged in electrical contact with (e.g. sandwiched between) conductive regions (C), in a (C/S/C) arrangement on a semiconductor (e.g. in a stack arrangement). The conductive region (C) may comprise any suitable material, and may comprise a transition metal oxide, and may further include any material comprising metal-like characteristics, including, for example, polysilicon or a doped semiconductor. In embodiments, the conductive region (C) may additionally or alternatively comprise a material selected from a group comprising aluminium, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

According to an embodiment, the switching region (S) may comprise any transition metal oxide (TMO) material, such as, for example, perovskites, Mott insulators, charge exchange insulators, and Anderson disorder insulators.

In particular implementations, the switching region (S) material may include switching materials such as nickel oxide, cobalt oxide, iron oxide, yttrium oxide, and perovskites such as Cr doped strontium titanate, lanthanum titanate, and the manganate family including praesydium calcium, manganate, and praesydium lanthanum manganite, just to provide a few examples. In particular, oxides incorporating elements with incomplete d and f orbital shells may exhibit sufficient resistive switching properties for use as a switching region (S) material. In an embodiment, the CES may be prepared without electroforming.

Other implementations may employ other transition metal compounds as the switching region (S) material without deviating from claimed subject matter. For example, {M(chxn)$_2$Br}Br$_2$ where M may comprise Pt, Pd, or Ni, and chxn comprises 1R, 2R-cyclohexanediamine, and other such metal complexes may be used without deviating from claimed subject matter.

In one aspect, the CEM may comprise materials that are TMO variable resistance materials, though it should be understood that these are exemplary only, and are not intended to limit claimed subject matter.

Particular implementations may employ other variable resistance materials as well. Whilst nickel oxide, NiO, is disclosed as one particular TMO above, NiO materials may also be doped with extrinsic ligands, which may stabilize variable resistance properties. In particular, NiO variable resistance materials disclosed herein may include a carbon containing ligand, which may be indicated by NiO(Cx). Here, one skilled in the art may determine a value of x for any specific carbon containing ligand and any specific combination of carbon containing ligand with NiO simply by balancing valences. In another particular example, NiO doped with extrinsic ligands may be expressed as NiO(Lx), where Lx is a ligand element or compound and x indicates a number of units of the ligand for one unit of NiO. One skilled in the art may determine a value of x for any specific ligand and any specific combination of ligand with NiO or any other transition metal simply by balancing valences.

Furthermore, the terminals may comprise the same materials as the conductive regions (C), such that the conductive regions (C) may function as the terminals. In embodiments where the material for the terminals and the conductive regions (C) are not the same, it is preferable that the different materials are matched to reduce the effects of border interactions or surface defects which may otherwise affect performance of the CES. For example, the materials should be matched to ensure the electrical properties (e.g. conductivities) and/or chemical properties (e.g. coefficients of thermal expansion match) of the CEM and terminals do not negatively impact the operation of the CES.

Whilst the embodiments above depict the memory array comprising rows and columns, the claims are not limited in this respect, and the bitcells may arranged in any appropriate configuration be selected and driven via signal lines as appropriate.

Computer program code for carrying out operations of the present techniques may be written in any combination of one or more programming languages, including object oriented programming languages and conventional procedural programming languages. For example, program code for carrying out operations of the present techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language).

According to an embodiment, devices described herein may be formed in devices in combination with conducting elements formed by the same or different processes. In an example implementation, memory devices may be formed in combination with conducting elements using a different and/or complementary process technologies such as complementary metal oxide semiconductor (CMOS) technologies. For example, conducting elements such as NFET and PFET devices may be formed using well known processes and techniques.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

It will be clear to one skilled in the art that many improvements and modifications can be made to the foregoing exemplary embodiments without departing from the scope of the present techniques.

What is claimed is:

1. A controller device comprising:
   a first buffer to provide an initialization queue, the initialization queue to maintain a record of pending requests to initialize states of portions of a memory, the pending requests to initialize to include at least a first pending request to initialize specifying a portion of the memory to be initialized, the record of pending requests to initialize to include times of receipt and/or origination of the pending requests to initialize;
   a second buffer to provide a write queue to maintain a record of pending write operation requests, the write queue to include at least a first pending write operation request specifying a portion of the memory to be written to, the record of pending write operation requests to include times of receipt and/or origination of the pending write operation requests; and
   circuitry to delay initiation of an operation to service the first pending write operation request until completion of an operation to service the first pending request to initialize responsive to detection of an at least partial overlap of the specified portion of the memory to be initialized and the specified portion of the memory to be written to, and responsive to an indication in the record of a time of receipt and/or origination of the first pending request to initialize.

2. The controller device of claim 1, wherein the initiation of the operation to service the first pending write operation request to comprise transmission of one or more signals on a memory bus connected to the memory, the one or more signals to be indicative of physical addresses corresponding to bitcells in the specified portion of the memory to be written to.

3. The controller device of claim 1, and further comprising circuitry to determine that the first pending write operation request was originated and/or received subsequent to origination and/or receipt of the first pending request to initialize based, at least in part, on states of the first and second buffers.

4. The controller device of claim 1, wherein the first pending write operation request is received from a processing unit subsequent to receipt of the first pending request to initialize.

5. The controller device of claim 1, wherein the specified portion of the memory to be initialized is to comprise bitcells corresponding with a first range of physical memory addresses and the specified portion of the memory to be written to is to comprise bitcells corresponding with a second range of physical memory addresses, and wherein the circuitry to delay initiation of the write operation is further to detect the at least partial overlap of the specified portion of the memory to be initialized and the specified portion of the memory to be written to as an at least partial overlap of the first range of physical memory addresses and the second range of physical memory addresses.

6. The controller device of claim 1, and further comprising:
 a third buffer to provide a read queue to maintain a record of pending read operation requests, the read queue to include at least a first pending read operation request specifying a portion of the memory to be read; and
 circuitry to return values representing an initialized state without access of the specified portion of the memory to be read responsive to detection of the first pending request to initialize.

7. The controller device of claim 6, wherein the specified portion of the memory to be initialized is to comprise bitcells corresponding with a first range of physical memory addresses and the portion of the memory to be read is to comprise bitcells corresponding with a third range of physical memory addresses, and wherein the circuitry to service the first pending read operation request addressed to the specified portion of the memory that is to be read is further to return values representing the initialized state without access of the specified portion of the memory to be read further responsive to a determination of an at least partial overlap of the first range of physical memory addresses and the third range of physical memory addresses.

8. A method, at a controller device, comprising:
 maintaining a record of pending requests to initialize states of portions of a memory in an initialization queue formed in a first buffer, the pending requests to initialize including at least a first pending request to initialize specifying a portion of the memory to be initialized, the record to include times of receipt and/or origination of the pending requests to initialize states of portions of the memory;
 maintaining a record of pending write operation requests in a write queue formed in a second buffer, the pending write operation requests to include at least a first pending write operation request specifying a portion of the memory to be written to, the record of pending write operation requests to include times of receipt and/or origination of the pending write operation requests; and
 delaying initiation of an operation to service the first pending write operation request until completion of an operation to service the first pending request to initialize responsive to detection of an at least partial overlap of the specified portion of the memory to be initialized and the specified portion of the memory to be written to and responsive to an indication in the record of a time of receipt and/or origination of the first pending request to initialize.

9. The method of claim 8, wherein initiation of the operation to service the first pending write operation request to comprise transmission of one or more signals on a memory bus connected to the memory, the one or more signals to be indicative of addresses corresponding to bitcells in the specified portion of the memory to be written to.

10. The method of claim 8, and further comprising delaying initiation of the operation to service the first pending write operation request responsive to a determination that the first pending write operation request was originated and/or received subsequent to origination and/or receipt of the first pending request to initialize.

11. The method of claim 10, and further comprising determining that the first pending write operation request was originated and/or received subsequent to origination and/or receipt of the first pending request to initialize based, at least in part, on a state of the first buffer and a state of the second buffer.

12. The method of claim 8, wherein the first pending write operation request is received from a processing unit subsequent to receipt of the first pending request to initialize.

13. The method of claim 8, wherein the specified portion of the memory to be initialized is to comprise bitcells corresponding with a first range of physical memory addresses and the specified portion of the memory to be written to is to comprise bitcells corresponding with a second range of physical memory addresses, and wherein the method further comprises delaying initiation of the operation to service the first pending write operation request further responsive to a determination of an at least partial overlap of the first range of physical memory addresses and the second range of physical memory addresses.

14. The method of claim 8, and further comprising:
 maintaining a record of pending read operation requests in a read queue formed in a third buffer, the read queue to include at least a first pending read operation request specifying a portion of the memory to be read; and
 servicing the first pending read operation request by returning values representing an initialized state without access of the specified portion of the memory to be read responsive to detection of the first pending request to initialize the first portion of the memory.

15. The method of claim 14, wherein the specified portion of the memory to be initialized comprises bitcells corresponding with a first range of physical memory addresses and the specified portion of the memory to be read comprises bitcells corresponding with a third range of physical memory addresses, and wherein the method further comprises servicing the first pending read request operation by returning values representing the initialized state without accessing the specified portion of the memory to be read further responsive to a determination of an at least partial overlap of the first range of physical memory addresses and the third range of physical memory addresses.

\* \* \* \* \*